US012725669B2

(12) United States Patent
Shukla et al.

(10) Patent No.: US 12,725,669 B2
(45) Date of Patent: Sep. 1, 2026

(54) TECHNIQUES FOR MANAGING A VOLTAGE RECOVERY OPERATION

(71) Applicant: Micron Technology, Inc., Boise, ID (US)

(72) Inventors: Pitamber Shukla, Boise, ID (US); Robert Winston Mason, Boise, ID (US); Huai-Yuan Tseng, San Ramon, CA (US); Akira Goda, Tokyo (JP); Kishore Kumar Muchherla, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 18/648,110

(22) Filed: Apr. 26, 2024

(65) Prior Publication Data

US 2024/0371452 A1 Nov. 7, 2024

Related U.S. Application Data

(60) Provisional application No. 63/463,506, filed on May 2, 2023.

(51) Int. Cl.
*G11C 16/20* (2006.01)
*G11C 16/34* (2006.01)

(52) U.S. Cl.
CPC .......... *G11C 16/3495* (2013.01); *G11C 16/20* (2013.01); *G11C 16/3404* (2013.01); *G11C 16/3418* (2013.01); *G11C 16/349* (2013.01)

(58) Field of Classification Search
CPC . G11C 16/3495; G11C 16/20; G11C 16/3404; G11C 16/3418; G11C 16/349; G11C 13/0033
See application file for complete search history.

(56) References Cited

U.S. PATENT DOCUMENTS 11,133,083 B1 * 9/2021 Fitzpatrick ............... G11C 7/04
2017/0255403 A1 * 9/2017 Sharon .................... G06F 3/064
2020/0185045 A1 * 6/2020 Chen ................... G06F 11/1048
2021/0057026 A1 * 2/2021 Sarpatwari ............. G11C 5/144
2021/0202012 A1 * 7/2021 Han ....................... G11C 16/26
2022/0057934 A1 * 2/2022 Sheperek .............. G06F 1/3228
2022/0121520 A1 * 4/2022 Hwang ............... G06F 11/1048
2022/0300186 A1 * 9/2022 Muchherla ............ G06F 3/0653
2023/0012648 A1 * 1/2023 Fitzpatrick ......... G11C 16/3404
(Continued)

*Primary Examiner* — Amir Zarabian
*Assistant Examiner* — Justin Bryce Heisterkamp
(74) *Attorney, Agent, or Firm* — Holland & Hart LLP

(57) ABSTRACT

Methods, systems, and devices for techniques for managing a voltage recovery operation are described. In some cases, as part of performing a write command to store data to a set of memory cells, the memory system may store an indication of the initial time at which the write operation occurred, the temperature of the set of memory cells at the initial time, or both. The memory system may subsequently manage an accumulated value based on a duration from the initial time and the temperature of the set of memory cells during the duration. If the accumulated value exceeds an accumulation threshold, the memory system may identify an indication of degradation of the set of memory cells. If the indication exceeds a degradation threshold, the memory system may perform a voltage recovery operation to modify voltages of the set of memory cells.

20 Claims, 7 Drawing Sheets

600

(56) References Cited

U.S. PATENT DOCUMENTS

| | | | | |
|---|---|---|---|---|
| 2023/0252276 | A1* | 8/2023 | Tran | G06F 17/12<br>706/38 |
| 2023/0315332 | A1* | 10/2023 | Duval | G06F 3/0679 |
| 2023/0395098 | A1* | 12/2023 | Song | H03L 7/0995 |
| 2024/0071440 | A1* | 2/2024 | Mason | G11C 16/10 |
| 2024/0160386 | A1* | 5/2024 | Bueb | G11C 7/04 |
| 2024/0202110 | A1* | 6/2024 | Bonitz | G11C 11/406 |
| 2024/0221804 | A1* | 7/2024 | Wang | G11C 7/1096 |

* cited by examiner

400

500

TECHNIQUES FOR MANAGING A VOLTAGE RECOVERY OPERATION

CROSS REFERENCE

The present application for patent claims priority to U.S. Patent Application No. 63/463,506 by Mason et al., entitled "TECHNIQUES FOR MANAGING A VOLTAGE RECOVERY OPERATION," filed May 2, 2023, which is assigned to the assignee hereof, and which is expressly incorporated by reference in its entirety herein.

TECHNICAL FIELD

The following relates to one or more systems for memory, including techniques for managing a voltage recovery operation.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
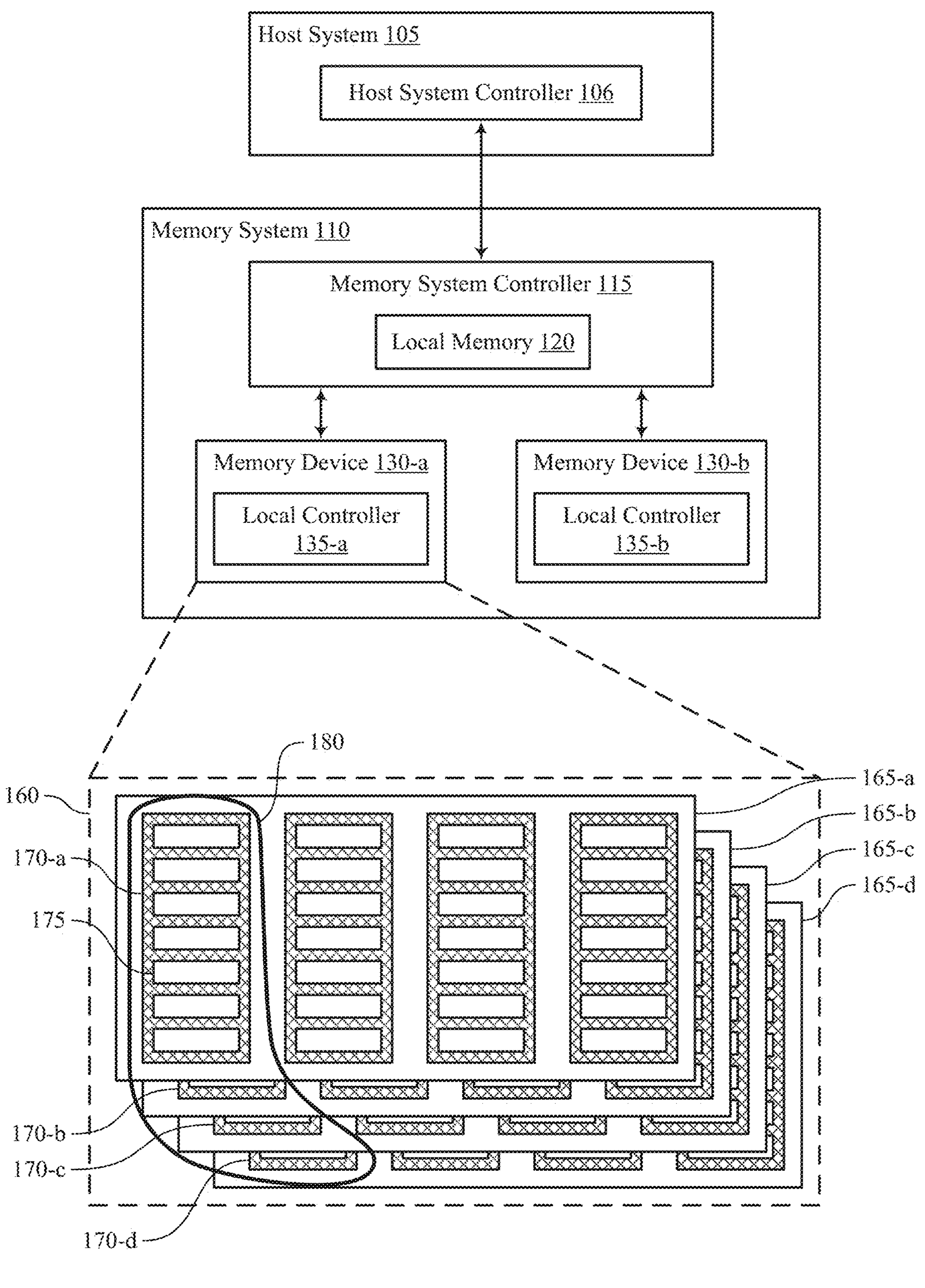
FIG. 1 illustrates an example of a system that supports techniques for managing a voltage recovery operation in accordance with examples as disclosed herein.

Memory systems, such as not-and (NAND) devices, may include non-volatile memory cells which may undergo charge loss over time, which may be accelerated as the temperature of the memory system increases. Some memory cells, such as memory cells configured to store multiple bits of data (e.g., multi-level cells (MLC), triple level cells (TLC), quad level cells (QLC)), may have an increased risk of data corruption due to charge loss. To mitigate errors introduced by charge loss, some memory systems may routinely perform refresh operations to transfer (e.g., read and rewrite) data stored in a source block of memory cells to one or more target blocks of memory cells. However, such refresh operations may include performing multiple write commands, which may significantly contribute to the write amplification of the memory system, and accordingly shorten the lifespan of the memory system. Additionally or alternatively, a memory system may use a voltage recovery operation, which may modify (e.g., increase) the voltage of memory cells in a block without performing additional write operations and/or moving the data to a new target block. In some examples, a memory system may perform voltage recovery operations at a fixed rate across all blocks of memory cells of the memory system. However, different blocks of memory cells, different memory devices within a memory system, or both may undergo different environmental conditions, such as differences in temperature, differences in quantity of access operations, or both, and thus may undergo different amounts of charge loss in a same duration. Accordingly, techniques to modify the rate at which voltage recovery operations are performed are desired.

As described herein, a memory system may dynamically adjust the rate at which voltage recovery operations are performed. For example, as part of performing a write command to store data to a set of memory cells (e.g., a block of memory cells), the memory system may store an indication of the initial time at which the write operation occurred, the temperature of the set of memory cells at the initial time, or both. The memory system may subsequently manage an accumulated value based on a duration from the initial time and the temperature of the set of memory cells during the duration. If the accumulated value exceeds an accumulation threshold, the memory system may identify an indication of degradation (e.g., may measure an indication of charge loss) of the set of memory cells. If the indication exceeds a degradation threshold, the memory system may perform a voltage recovery operation to modify voltages of the set of memory cells. Additionally or alternatively, if the indication exceeds an evaluation threshold, the memory system may adjust the accumulation threshold, the degradation threshold, or both. By accounting for differences in temperature, such techniques may allow for a more targeted and efficient rate at which voltage recovery operations are performed for the set of memory cells, which may improve system performance, extend the life of the memory system, may reduce the rate of errors for data stored in the set of memory cells, or a combination thereof.

Features of the disclosure are initially described in the context of systems, devices, and circuits with reference to FIG. 1. Features of the disclosure are described in the context of distribution plots and process flows with reference to FIGS. 2 through 4. These and other features of the disclosure are further illustrated by and described in the context of an apparatus diagram and flowchart that relate to techniques for managing a voltage recovery operation with reference to FIGS. 5 through 7.

FIG. 1 illustrates an example of a system 100 that supports techniques for managing a voltage recovery operation in accordance with examples as disclosed herein. The system 100 includes a host system 105 coupled with a memory system 110. The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other devices.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at a page level of granularity, or portion thereof) but may be erased at a second level of granularity (e.g., at a block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support techniques for managing a voltage recovery operation. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some cases, a memory system 110 may dynamically adjust the rate at which voltage recovery operations are performed. For example, as part of performing a write command to store data to a set of memory cells (e.g., a block 170 of memory cells), the memory system 110 may store an indication of the initial time at which the write operation occurred, the temperature of the set of memory cells at the initial time, or both. The memory system 110 may subsequently manage an accumulated value based on a duration from the initial time and the temperature of the set of memory cells during the duration. If the accumulated value exceeds an accumulation threshold, the memory system 110 may identify an indication of degradation (e.g., may measure an indication of charge loss) of the set of memory cells. If the indication exceeds a degradation threshold, the memory system 110 may perform a voltage recovery operation to modify voltages of the set of memory cells. By accounting for differences in temperature, such techniques may allow for a more targeted and efficient rate at which voltage recovery operations are performed for the set of memory cells, which may improve system performance, may reduce the rate of errors for data stored in the set of memory cells, or both.

Figure 2:
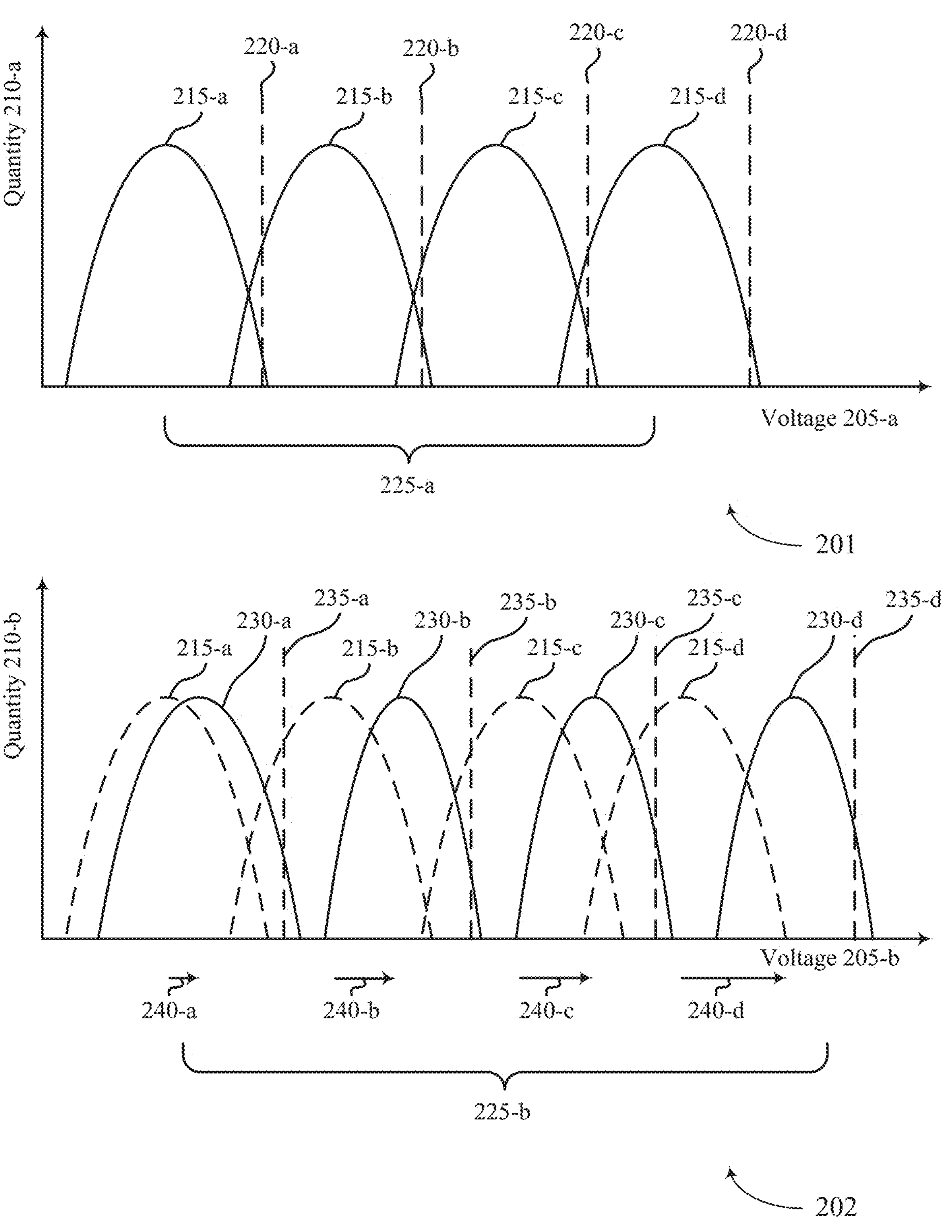
FIG. 2 illustrates examples of distribution plots that support techniques for managing a voltage recovery operation in accordance with examples as disclosed herein.

FIG. 2 illustrates an example of a distribution plot 201 and a distribution plot 202 that supports techniques for managing a voltage recovery operation in accordance with examples as disclosed herein. The distribution plot 201 and the distribution plot 202 may include a voltage axis 205-*a* and a voltage axis 205-*b*, respectively, along with a quantity axis 210-*a* and a quantity axis 210-*b*, respectively. Generally, the distribution plots 201 and 202 may illustrate example distributions for the voltages of signals read from (e.g., in response to reading) memory cells in a memory array before and after a voltage recovery operation, such as an in-field touch up (IFTU) operation.

By way of example, the distribution plots 201 and 202 illustrate distributions of voltages within a set of memory cells in which each memory cell may be configured to store multiple bits, such as an MLC block of memory cells. For example, the distribution plot 201 may illustrate voltage distributions 215 of a set of memory cells (e.g., a page of memory cells, a block of memory cells) after a charge loss event, such as charge loss due to quick charge loss, retention during a duration in which the memory system is powered off, slow charge loss, charge loss due to temperature, or a combination thereof.

The distribution plot 201 may include a first distribution 215-*a* of voltages corresponding to a first logic state (e.g., a logical 00), a second distribution 215-*b* of voltages corresponding to a second logic state (e.g., a logical 01), a third distribution 215-*c* of voltages corresponding to a third logic state (e.g., a logical 10), and a fourth distribution 215-*d* of voltages corresponding to a fourth logic state (e.g., a logical 11). Although FIG. 2 depicts distributions of an MLC block, the teaching described herein may be readily applied to other types of memory blocks, such as SLC blocks, TLC blocks, QLC blocks, or other blocks of memory cells.

Each of the distributions 215-*a*, 215-*b*, 215-*c*, and 215-*d* may be associated with a respective threshold 220-*a*, 220-*b*, 220-*c*, and 220-*d*, such as a voltage threshold, though a current threshold or charge threshold may additionally or alternative be used. The thresholds 220 may be used as part of one or more access operations (e.g., read operations). For example, if a sense component of the memory device detects a voltage lower than the threshold 220-*a*, the memory device may read the corresponding memory cell as storing the first logic value (e.g., a logic 00), if the sense component of the memory device detects a voltage lower than the threshold 220-*b*, the memory device may read the corresponding memory cell as storing the second logic value (e.g., a logic 01), if the sense component of the memory device detects a voltage lower than the threshold 220-*c*, the memory device may read the corresponding memory cell as storing the third logic value (e.g., a logic 10), and if the sense component of the memory device detects a voltage lower than the threshold 220-*d*, the memory device may read the corresponding memory cell as storing the fourth logic value (e.g., a logic 11).

The relative width of a distribution plot may be expressed by a voltage window 225, which may be an example of a read window budget. For example, the voltage window 225-*a* may correspond to a difference in voltage of a threshold 220, such as the threshold 220-*d*, and a lower threshold 220, such as the threshold 220-*a*. In some examples, the voltage window 225 may be reduced over time due to charge loss (e.g., quick charge loss, retention loss) associated with the set of memory cells. A reduced voltage window 225-*a* may be associated with overlapping distributions 215, as depicted by the distribution plot 201. Such overlap may result in a portion of a distribution 215 falling below a threshold 220 associated with a separate distribution 215 (e.g., the tail of the distribution 215-*b* may fall below the threshold 220-*a*). Further, charge loss may cause a distribution 215 to move to a lower voltage on the distribution plot 201, widen (e.g., cover a larger range of voltage), or both. A reduced threshold window 225-*a* may thus result in decreased performance of the set of memory cells, such as by increasing the rate of errors of data read from the set of memory cells (e.g., a ratio of the quantity of error bits in the data to the total quantity of bits in the data, a raw bit error rate (RBER)), decreasing the speed of a read operation for the set of memory cells, or both.

To counter a reduction in a voltage window 225, the memory system may routinely perform one or more operations on the set of memory cells. For example, the memory system may perform a refresh operation on the set of memory cells, in which the memory system may read data stored in the set of memory cells and transfer the data to one or more different memory cells, such as by writing the data to one or more separate memory blocks. Such transferring of data may "refresh" the voltage window 225, and accordingly improve performance. However, a refresh operation may include a relatively large quantity of write operations, which may contribute to the write amplification of the memory system, and thus may reduce the lifetime of the memory system.

Additionally or alternatively, the memory system may perform a voltage recovery operation on the set of memory cells. The voltage recovery operation may modify (e.g., increase, add to) the voltage of each memory cell of the set of memory cells to counter or compensate for reduced voltage due to charge loss. For example, the distribution plot 202 may include a first distribution 230-*a* of voltages corresponding to the first logic state, a second distribution 230-*b* of voltages corresponding to a second logic state, a third distribution 230-*c* of voltages corresponding to the third logic state, and a fourth distribution 230-*d* of voltages corresponding to the fourth logic state.

Each distribution 230 of voltages may be offset from the associated distributions 215 of voltages by an offset value 240. For example, the voltage recovery operation may add a first offset value 240-*a* to stored voltages of memory cells associated with the distribution 215-*a* of voltages to obtain the distribution 230-*a* of voltages, may add a second offset value 240-*b* to stored voltages of memory cells associated with the distribution 215-*b* of voltages to obtain the distribution 230-*b* of voltages, may add a third offset value 240-*c* to stored voltages of memory cells associated with the distribution 215-*c* of voltages to obtain the distribution 230-*c* of voltages, and may add a fourth offset value 240-*d* to stored voltages of memory cells associated with the distribution 215-*d* of voltages to obtain the distribution 230-*d* of voltages. In some cases, the voltage recovery operation may additionally modify the shape of each distribution 230 of voltages. For example, the voltage recovery operation may "tighten" or narrow each distribution 230 of voltages, such that each distribution 230 of voltages covers a smaller respective range of voltages. Additionally, each of the distributions 230-*a*, 230-*b*, 230-*c*, and 230-*d* may be associated with a respective modified threshold 235-*a*, 235-*b*, 235-*c*, and 235-*d* (e.g., a voltage threshold, a read threshold), which may be based on or may correspond to adding the respective offset value 240 to the respective threshold 220.

In some case, the memory system may dynamically adjust the rate at which voltage recovery operations are performed. For example, as part of performing a write command to store data to a set of memory cells (e.g., a block of memory cells), the memory system may store an indication of the initial time at which the write operation occurred, the temperature of the set of memory cells at the initial time, or both. The memory system may subsequently manage an accumulated value based on a duration from the initial time and the temperature of the set of memory cells during the duration. If the accumulated value exceeds an accumulation threshold, the memory system may identify an indication of degradation (e.g., may measure an indication of charge loss) of the set of memory cells. If the indication exceeds a degradation threshold, the memory system may perform a voltage recovery operation to modify voltages of the set of memory cells, which may increase the voltage window 225-*b* relative to the voltage window 225-*a*.

Figure 3:
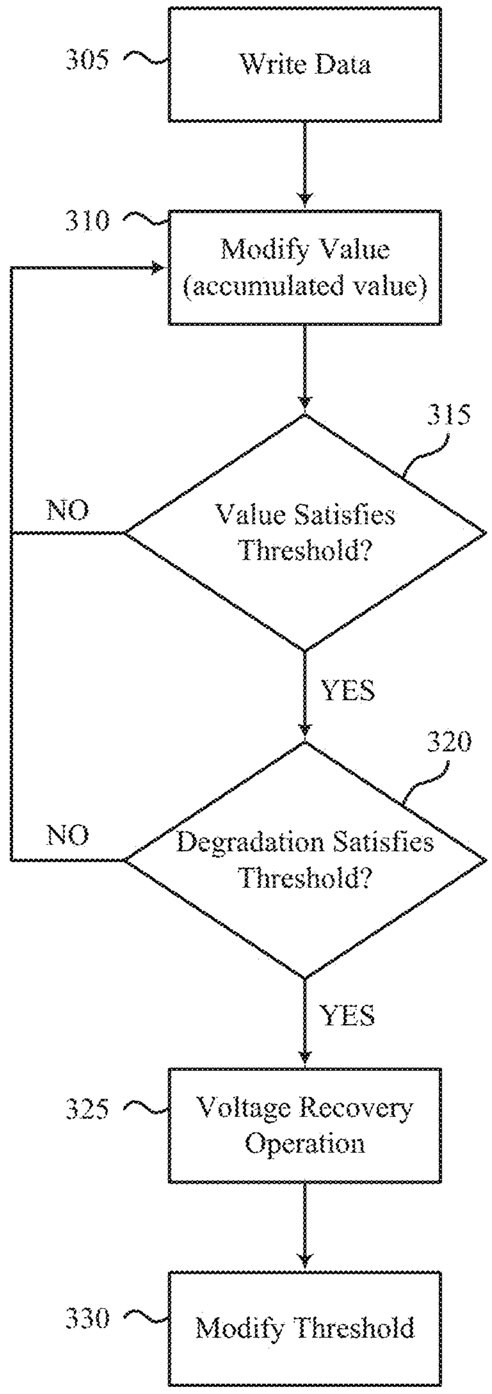
FIG. 3 illustrates an example of a process flow that supports techniques for managing a voltage recovery operation in accordance with examples as disclosed herein.

FIG. 3 illustrates an example of a process flow 300 that supports techniques for managing a voltage recovery operation in accordance with examples as disclosed herein. In some examples, a memory system, such as the memory system 110 as described with reference to FIG. 1, may implement the process flow 300 using a memory system controller (e.g., a memory system controller 115). In the following description of process flow 300, the operations may be performed in a different order than the order shown. For example, specific operations may also be left out of process flow 300, or other operations may be added to process flow 300.

The process flow 300 may illustrate a method to adjust a rate (e.g., a cadence) at which voltage recovery operations are performed on a set of memory cells of the memory system. In some examples, the memory system may perform voltage recovery operations at a fixed rate (e.g., a fixed period), or may perform voltage recovery operations at a same rate across different sets of memory cells (e.g., different blocks of memory cells, different memory dies or memory devices). However, different sets of memory cells may undergo degradation (e.g., charge loss, such as quick charge loss, retention, or both) at differing rates, due to factors such as temperature, frequency of access, or other characteristic particular to a block of memory cells. For example, a first set of memory cells with a temperature higher than a second set of memory cells may experience a higher rate of degradation, and accordingly may benefit from a relatively higher rate of voltage recovery operations. Accordingly, the memory system may modify the rate at which voltage recovery operations are performed for a set of memory cells.

For example, at 305, as part of performing a write operation to write data to a set of memory cells, the memory system may store one or more values associated with the set of memory cells. For example, the memory system may store an initial time corresponding to the time at which the memory system performed the write operation. Additionally, the memory system may store a value associated with the temperature of the set of memory cells, such as the temperature of the set of memory cells at the initial time, a value based on the initial time and the temperature of the set of memory cells at the initial time, or both. As used herein, the value based on the initial time and the temperature of the set of memory cells at the initial time may be referred to as the accumulated value. In some cases, the memory system may store the one or more values within the set of memory cells, such as in a page of the array of the set of memory cells. Additionally or alternatively, the memory system may store the one or more values in a volatile memory, such as a low power on-die memory (e.g., one or more buffers, one or more registers).

At 310, the memory system may modify at least one value of the one or more values. For example, the memory system may modify the accumulated value. To modify the accumulated value, the memory system may include one or more accumulators, such as a time accumulator (e.g., a NAND oscillator), a temperature accumulator (e.g., a thermal sensor), or both.

In some cases, the time accumulator may record or measure a second time corresponding to an amount of time from the initial time (e.g., a quantity of oscillations, a quantity of time units), and the temperature accumulator may record or measure the temperature of the set of memory cells at each time unit of the time accumulator. The memory system may modify the accumulated value by adding an amount to the accumulated value. In some cases the time accumulator, the temperature accumulator, or both may accumulate the time and temperature throughout the operation of the memory system, for example as part of background operations (e.g., background monitoring operations).

The added amount may be based on the temperature at each time unit and a duration from the initial time. For example, the added amount may correspond to a sum of a product of each time unit and the temperature of the set of memory cells at the time unit. Accordingly, the accumulated value may correspond to or may approximate an integral of the temperature of the set of memory cells over time. In some cases, the accumulated value may be further based on metadata specific to the set of memory cells, such as a scaling value. In such cases, the accumulated value may correspond to a product of the scaling value and the sum of the product of each time unit and the temperature of the set of memory cells at the time unit.

At 315, the memory system may determine whether the accumulated value satisfies an accumulation threshold. For example, after a duration in which the time accumulator, the temperature accumulator, or both modify the accumulated value, the memory system may compare the accumulated value to the accumulation threshold to determine whether the accumulated value exceeds the accumulation threshold. In some cases, the accumulation threshold may be an example of metadata associated with the set of memory cells, and may be a configurable quantity which may be modified to control the rate at which voltage recovery operations are performed.

If the memory system determines that the accumulated value does not satisfy the accumulation threshold, the process flow 300 may return to 310, and the memory system may continue modifying the accumulated value. Alternatively, if the memory system determines that the accumulated value satisfies the threshold, the memory system may, at 320, determine whether an indication of degradation of the distribution of voltages of the set of memory cells satisfies a degradation threshold.

Upon determining that the accumulated value satisfies the accumulation threshold, the memory system may perform an operation to identify the indication of degradation. In some cases, the indication of degradation may include a measurement of a voltage difference between a first voltage associated with a first logic state of the set of memory cells and a second voltage associated with a second logic state of the set of memory cells. For example, the memory system may identify the voltage window (e.g., the voltage window 225 as described with reference to FIG. 2) associated with the distributions of voltages. In such an example, the degradation threshold may include an estimated or expected voltage window (e.g., an estimate of the voltage window based on the duration since the initial time). Accordingly, if the memory system determines that the measured voltage window (e.g., measured read window budget) is less than the expected voltage window (e.g., expected read window budget), the memory system may determine that the set of memory cells has degraded beyond an expected amount, and may thus determine that the measured voltage window satisfies the degradation threshold.

Additionally or alternatively, the indication of degradation may include a measurement of a bit error rate of the set of memory cells. For example, the memory system may measure an RBER of the set of memory cells (e.g., by reading data from the set of memory cells and performing an error detection operation on the data). In such an example, the degradation threshold may include an estimated or expected bit error rate. Accordingly, if the memory system determines that the measured bit error rate is greater than the expected bit error rate, the memory system may determine that the set of memory cells has degraded beyond an expected amount, and may thus determine that the measured bit error rate satisfies the degradation threshold. Although described in the context of a voltage window or a bit error rate, other indications of degradation may be used, such as an indication of edge margin for the distribution of voltages, an indication of a width of the distribution of voltages (e.g., a level width), or both.

If the memory system determines that the indication of degradation does not satisfy the degradation threshold, the process flow 300 may return to 310, and the memory system may continue modifying the accumulated value. Alternatively, if the memory system determines that the indication of degradation satisfies the degradation threshold, the memory system may, at 325, perform a voltage recovery operation on the set of memory cells, as described in greater detail with reference to FIG. 2.

In some cases, at 330, the memory system may modify the accumulation threshold, the degradation threshold, or both in order to control the rate (e.g., increase the rate, decrease the rate) at which the voltage recovery operation is performed. For example, to increase the rate at which the voltage recovery operation is performed, the memory system may decrease the accumulation threshold, which may cause the memory system to determine that a subsequent accumulated value satisfies the updated accumulation threshold more frequently.

In some examples, the granularity of the set of memory cells may correspond to a group of blocks of memory cells. For example, the memory system may store and manage a single common accumulated value for multiple blocks of memory cells, and may perform the voltage recovery operation on each of the blocks of memory cells based on the common accumulated value satisfying the accumulation threshold and an indication of degradation of the blocks of memory cells satisfying the degradation threshold. Additionally or alternatively, the memory system may store and manage multiple accumulated values, each corresponding to respective single block of memory cells. In such cases, the memory system may perform the voltage recovery operation on individual blocks of memory cells, based on an accumulated value for the block of memory cells satisfying an accumulation threshold corresponding to the block of memory cells and an indication of degradation of the block of memory cells satisfying a degradation threshold corresponding to the block of memory cells.

Figure 4:
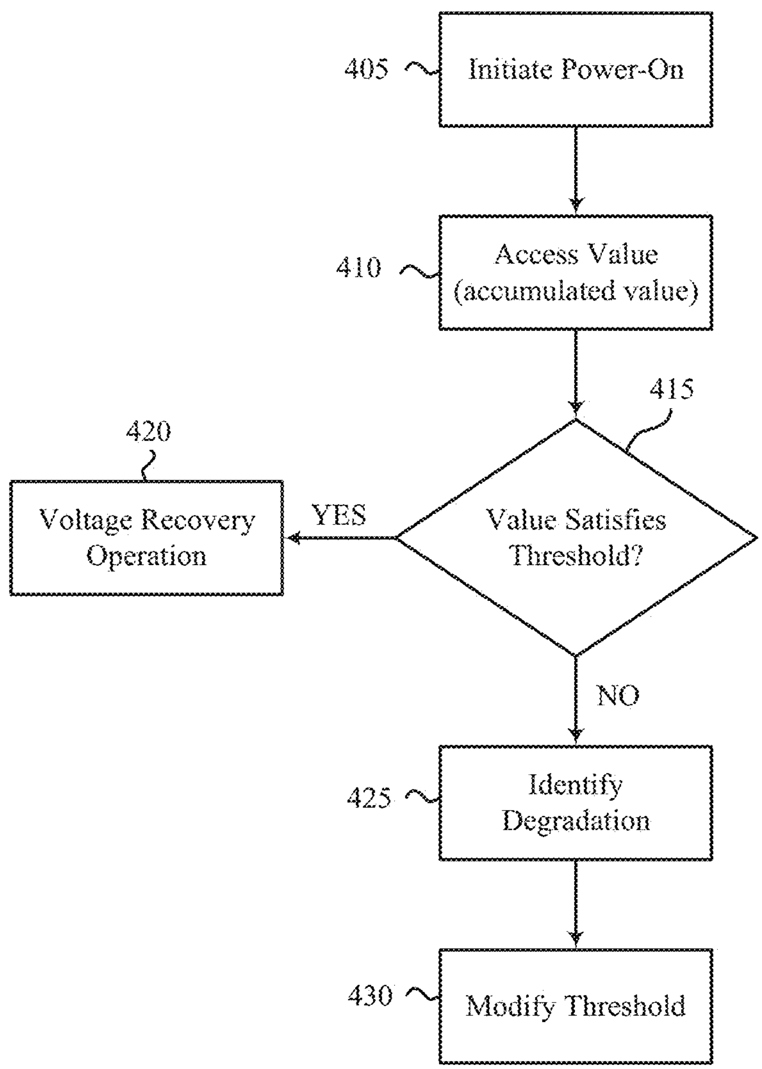
FIG. 4 illustrates an example of a process flow that supports techniques for managing a voltage recovery operation in accordance with examples as disclosed herein.

FIG. 4 illustrates an example of a process flow 400 that supports techniques for managing a voltage recovery operation in accordance with examples as disclosed herein. In some examples, a memory system, such as the memory system 110 as described with reference to FIG. 1, may implement the process flow 400 using a memory system controller (e.g., a memory system controller 115). In the following description of process flow 400, the operations may be performed in a different order than the order shown. For example, specific operations may also be left out of process flow 400, or other operations may be added to process flow 400.

The process flow 400 may illustrate a method to manage the rate at which voltage recovery operations are performed in a set of memory cells as part of a power loss event (e.g., an unexpected power loss, an asynchronous power loss). Because the memory system may not store or have access to a value indicating a duration for which the memory system was powered down, upon being powered on, the memory system may determine an estimated degradation based on a stored accumulated value, which may be used as part of subsequent voltage recovery operations. Because the rate of degradation may be the same or similar across all blocks of memory cells of the memory system during the powered down duration, the memory system may, in some cases, determine an estimated degradation for a single blocks of memory cells or a subset of the blocks of memory cells of the memory system, and may use the estimated degradation to modify a rate at which voltage recovery operations are performed for each block of memory cells of the memory system.

For example, at 405, the memory system may initiate a power-on operation, such as a booting operation. As part of the power-on operation, the memory system may, at 410, access a stored accumulated value, such as an accumulated value for a set of memory cells (e.g., a test set of memory cells, a sample set of memory cells) stored prior to the power loss event. In some cases, the accumulated value may be based on a time at which a write operation occurred for the set of memory cells and a temperature at which the write operation occurred, as described in greater detail with reference to FIG. 3.

At 415, the memory system may determine whether the accumulated value, an updated accumulated value (e.g., updated based on the temperature of the memory system during the power on operation), or both satisfy an accumulation threshold. In some examples, the accumulation threshold may correspond to a stored accumulation threshold (e.g., an accumulation threshold determined using the process flow 300 and stored prior to the power loss event). Additionally or alternatively, the memory system may modify the accumulation threshold, for example by reducing the accumulation threshold by a guard-band amount.

If the memory system determines that the accumulated value satisfies the accumulation threshold, the memory system may, at 420, perform a voltage recovery operation on the set of memory cells, as described in greater detail with reference to FIG. 2. Alternatively, if the memory system determines that the accumulated value does not satisfy the accumulation threshold, the memory system may identify an adjustment to the accumulated value.

For example, at 425, the memory system may identify an indication of degradation of the set of memory cells (e.g., by measuring a voltage window, by measuring a bit rate). The memory system may compare the measured indication of degradation with an expected degradation based on the accumulated value. For example, the memory system may associate an amount of degradation with a commensurate accumulated value. Accordingly, if the amount of degradation associated with the stored accumulated value is less than (e.g., by a threshold amount) the measured indication of degradation, the memory system may determine to modify the accumulated value to more accurately represent the measured indication of degradation.

At 430, the memory system may adjust the accumulated value based on comparing the measured indication of degradation with the expected degradation. For example, using the difference between the measured indication of degradation and the expected degradation, the memory system may determine an offset amount for the accumulated value corresponding to the difference. The memory system may apply (e.g., add) the offset to the accumulated value. In some examples, the memory system may determine the offset value using a mapping between degradation values and accumulated values (e.g., a look-up table).

In some examples, the memory system may use the adjusted accumulated value for subsequent methods to adjust the rate at which voltage recovery operations are performed across multiple blocks of memory cells. For example, the memory system may adjust the accumulated value for each block of memory cells of the memory system using the identified offset amount, and may begin adding to each accumulated value (e.g., as described in greater detail at 310 as described with reference to FIG. 3).

Figure 5:
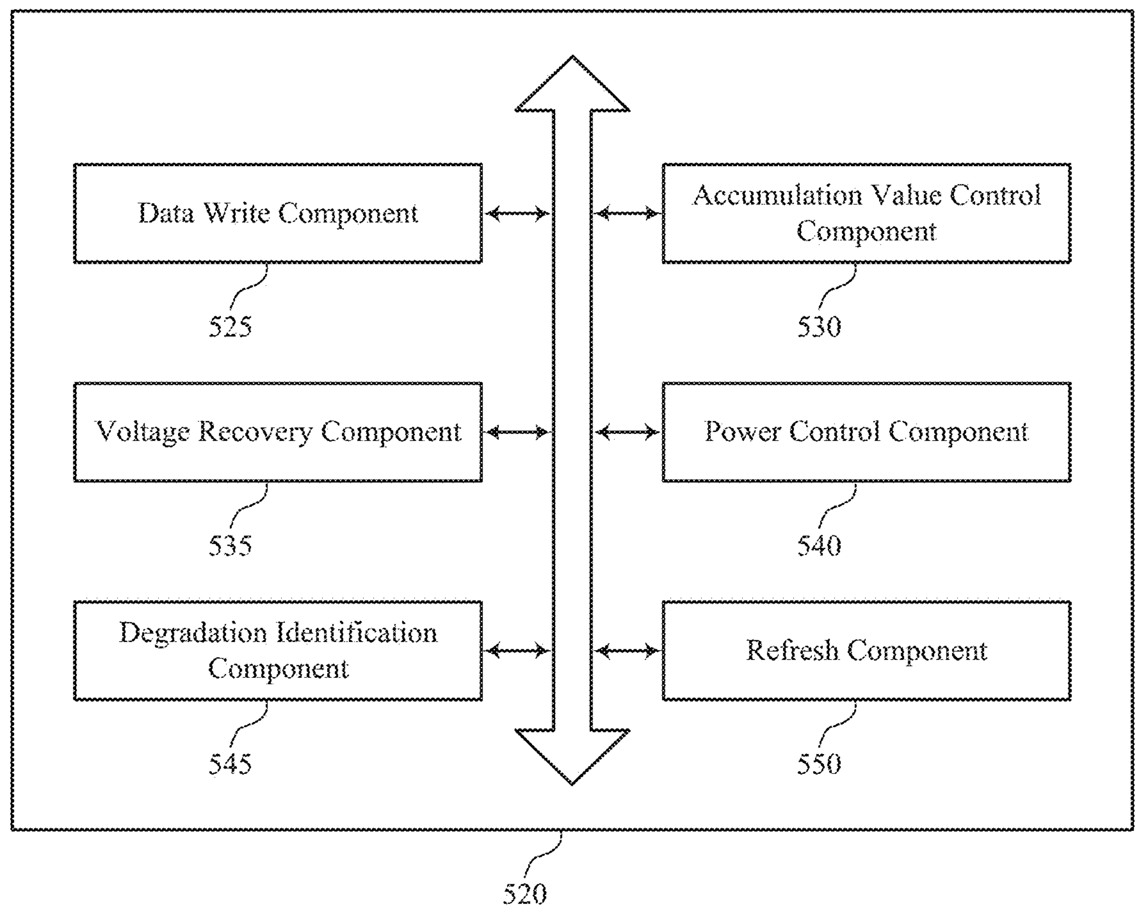
FIG. 5 illustrates a block diagram of a memory system that supports techniques for managing a voltage recovery operation in accordance with examples as disclosed herein.

FIG. 5 illustrates a block diagram 500 of a memory system 520 that supports techniques for managing a voltage recovery operation in accordance with examples as disclosed herein. The memory system 520 may be an example of aspects of a memory system as described with reference to FIGS. 1 through 4. The memory system 520, or various components thereof, may be an example of means for performing various aspects of techniques for managing a voltage recovery operation as described herein. For example, the memory system 520 may include a data write component 525, an accumulation value control component 530, a voltage recovery component 535, a power control component 540, a degradation identification component 545, a refresh component 550, or any combination thereof. Each of these components may communicate, directly or indirectly, with one another (e.g., via one or more buses).

The data write component 525 may be configured as or otherwise support a means for performing a write operation to write data to a set of memory cells and to write a value associated with the set of memory cells, the value based on a first temperature associated with the set of memory cells at a first time of performing the write operation. The accumulation value control component 530 may be configured as or otherwise support a means for determining whether the value satisfies a threshold at a second time after the first time, the value based on the first temperature and a second temperature of the set of memory cells at the second time. The voltage recovery component 535 may be configured as or otherwise support a means for performing a voltage recovery operation to modify a respective voltage of each memory cell of a subset of the set of memory cells based on determining that the value satisfies the threshold.

In some examples, the accumulation value control component 530 may be configured as or otherwise support a means for modifying the value based on the second temperature and a duration between the first time and the second time, where determining whether the value satisfies the threshold is based on modifying the value.

In some examples, modifying the value is further based on a metadata associated with the set of memory cells.

In some examples, the degradation identification component 545 may be configured as or otherwise support a means for identifying an indication of degradation of the subset of the set of memory cells based on determining that the value satisfies the threshold, where performing the voltage recovery operation is further based on determining that the indication of degradation satisfies a second threshold.

In some examples, the degradation identification component 545 may be configured as or otherwise support a means for identifying an indication of degradation of a second subset of the set of memory cells based on determining that the value exceeds the threshold. In some examples, the voltage recovery component 535 may be configured as or otherwise support a means for refraining from performing a second voltage recovery operation for the second subset of memory cells based on determining that the indication of degradation of the second subset satisfies a third threshold.

In some examples, the indication of degradation is based on a voltage difference between a first voltage associated with a first logic state of the subset and a second voltage associated with a second logic state of the subset.

In some examples, the difference between the first voltage and the second voltage includes a read window budget associated with the subset.

In some examples, the indication of degradation is based on a bit error rate of the subset.

In some examples, the accumulation value control component 530 may be configured as or otherwise support a means for modifying the threshold based on comparing the indication of degradation with an expected degradation, the expected degradation based on a difference between the first time and the second time.

In some examples, performing the voltage recovery operation includes adding a respective voltage to each memory cell of a block of memory cells including the set of memory cells based on determining that the value satisfies the threshold.

In some examples, the accumulation value control component 530 may be configured as or otherwise support a means for identifying the first time based on an oscillator. In some examples, the accumulation value control component 530 may be configured as or otherwise support a means for measuring the first temperature based on a temperature sensor associated with the set of memory cells.

In some examples, the refresh component 550 may be configured as or otherwise support a means for performing a refresh operation to transfer data written to the set of memory cells to one or more second sets of memory cells based on determining that an indication of degradation of the set of memory cells exceeds a second threshold.

The power control component 540 may be configured as or otherwise support a means for initiating a power-on operation for a memory system. In some examples, the accumulation value control component 530 may be configured as or otherwise support a means for accessing a first value associated with a set of memory cells and stored at the memory system, the first value based on a first time associated with a write operation to the set of memory cells prior to the power-on condition and a temperature of the set of memory cells at the first time. In some examples, the accumulation value control component 530 may be configured as or otherwise support a means for adjusting the first value to a second value based on comparing an indication of degradation of a subset of the set of memory cells with an expected degradation, the expected degradation based on the first value.

In some examples, the accumulation value control component 530 may be configured as or otherwise support a means for determining whether a third value associated with the set of memory cells satisfies a threshold at a second time after the first time, the third value based on a second temperature of the set of memory cells and a duration between the time and the second time. In some examples, the voltage recovery component 535 may be configured as or otherwise support a means for performing a voltage recovery operation to modify a respective voltage of each memory cell of a subset of the set of memory cells based on determining that the third value satisfies the threshold.

In some examples, performing the voltage recovery operation includes adding a respective voltage to each memory cell of a block of memory cells including the set of memory cells based on determining that the third value satisfies the threshold.

In some examples, the degradation identification component 545 may be configured as or otherwise support a means for identifying the indication of degradation of the subset of the set of memory cells based on determining that the first value satisfies a threshold, where adjusting the first value to the second value is based on the indication.

In some examples, the indication of degradation is based on a voltage difference between a first voltage associated with a first logic state of the subset and a second voltage associated with a second logic state of the subset.

In some examples, the difference between the first voltage and the second voltage includes a read window budget associated with the subset.

In some examples, the indication of degradation is based on a bit error rate of the subset.

Figure 6:
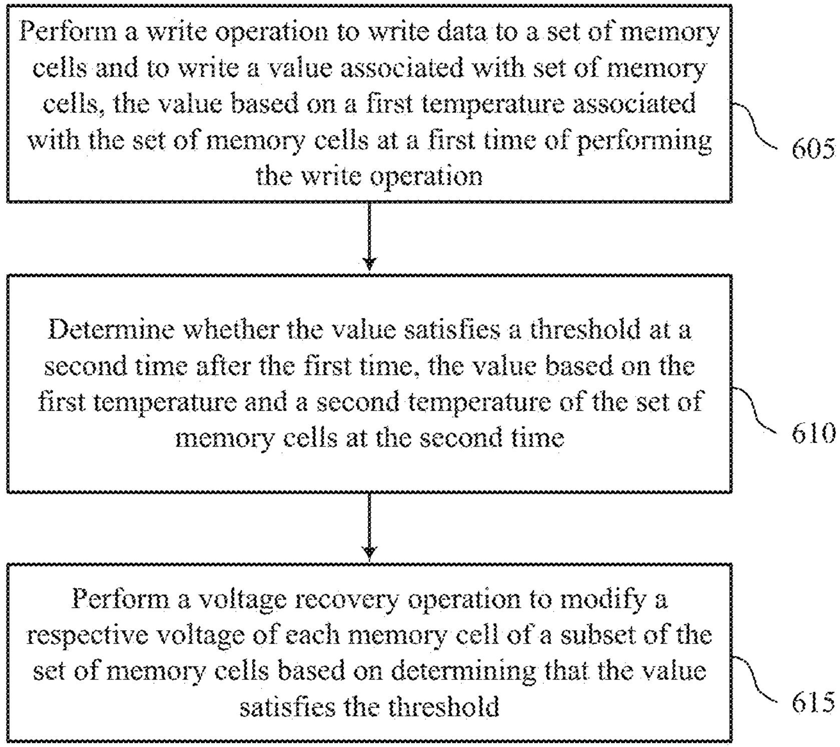
FIGS. 6 and 7 illustrate flowcharts showing a method or methods that support techniques for managing a voltage recovery operation in accordance with examples as disclosed herein.

FIG. 6 illustrates a flowchart showing a method 600 that supports techniques for managing a voltage recovery operation in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include performing a write operation to write data to a set of memory cells and to write a value associated with the set of memory cells, the value based on a first temperature associated with the set of memory cells at a first time of performing the write operation. The operations of 605 may be performed in accordance with examples as disclosed herein. In some examples, aspects of the operations of 605 may be performed by a data write component 525 as described with reference to FIG. 5. For example, the memory system may write the data to and, in some cases, the value to a block 170 of memory cells. In other cases, the memory system may write the value to the local memory 120—e.g., as described herein, including with reference to the operations described at 305 of FIG. 3.

At 610, the method may include determining whether the value satisfies a threshold at a second time after the first time, the value based on the first temperature and a second temperature of the set of memory cells at the second time. The operations of 610 may be performed in accordance with examples as disclosed herein. In some examples, aspects of the operations of 610 may be performed by an accumulation value control component 530 as described with reference to FIG. 5. For example, the memory system may compare the value to the threshold using the memory system controller 115 or a local controller 135—e.g., as described herein, including with reference to the operations described at 315 of FIG. 3.

At 615, the method may include performing a voltage recovery operation to modify a respective voltage of each memory cell of a subset of the set of memory cells based on determining that the value satisfies the threshold. The operations of 615 may be performed in accordance with examples as disclosed herein. In some examples, aspects of the operations of 615 may be performed by a voltage recovery component 535 as described with reference to FIG. 5. For example, the memory system may modify the voltage of each memory cell of the block 170 of memory cells which stores the data—e.g., as described herein, including with reference to the operations described at 325 of FIG. 3.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing a write operation to write data to a set of memory cells and to write a value associated with the set of memory cells, the value based on a first temperature associated with the set of memory cells at a first time of performing the write operation; determining whether the value satisfies a threshold at a second time after the first time, the value based on the first temperature and a second temperature of the set of memory cells at the second time; and performing a voltage recovery operation to modify a respective voltage of each memory cell of a subset of the set of memory cells based on determining that the value satisfies the threshold.

Aspect 2: The method, apparatus, or non-transitory computer-readable medium of aspect 1, further including operations, features, circuitry, logic, means, or instructions, or any combination thereof for modifying the value based on the second temperature and a duration between the first time and the second time, where determining whether the value satisfies the threshold is based on modifying the value.

Aspect 3: The method, apparatus, or non-transitory computer-readable medium of aspect 2, where modifying the value is further based on a metadata associated with the set of memory cells.

Aspect 4: The method, apparatus, or non-transitory computer-readable medium of any of aspects 1 through 3, further including operations, features, circuitry, logic, means, or instructions, or any combination thereof for identifying an indication of degradation of the subset of the set of memory cells based on determining that the value satisfies the threshold, where performing the voltage recovery operation is further based on determining that the indication of degradation satisfies a second threshold.

Aspect 5: The method, apparatus, or non-transitory computer-readable medium of aspect 4, further including operations, features, circuitry, logic, means, or instructions, or any combination thereof for identifying an indication of degradation of a second subset of the set of memory cells based on determining that the value exceeds the threshold and refraining from performing a second voltage recovery operation for the second subset of memory cells based on determining that the indication of degradation of the second subset satisfies a third threshold.

Aspect 6: The method, apparatus, or non-transitory computer-readable medium of any of aspects 4 through 5, where the indication of degradation is based on a voltage difference between a first voltage associated with a first logic state of the subset and a second voltage associated with a second logic state of the subset.

Aspect 7: The method, apparatus, or non-transitory computer-readable medium of aspect 6, where the difference between the first voltage and the second voltage includes a read window budget associated with the subset.

Aspect 8: The method, apparatus, or non-transitory computer-readable medium of any of aspects 4 through 7, where the indication of degradation is based on a bit error rate of the subset.

Aspect 9: The method, apparatus, or non-transitory computer-readable medium of any of aspects 4 through 8, further including operations, features, circuitry, logic, means, or instructions, or any combination thereof for modifying the threshold based on comparing the indication of degradation with an expected degradation, the expected degradation based on a difference between the first time and the second time.

Aspect 10: The method, apparatus, or non-transitory computer-readable medium of any of aspects 1 through 9, where performing the voltage recovery operation includes adding a respective voltage to each memory cell of a block of memory cells including the set of memory cells based on determining that the value satisfies the threshold.

Aspect 11: The method, apparatus, or non-transitory computer-readable medium of any of aspects 1 through 10, further including operations, features, circuitry, logic, means, or instructions, or any combination thereof for identifying the first time based on an oscillator and measuring the first temperature based on a temperature sensor associated with the set of memory cells.

Aspect 12: The method, apparatus, or non-transitory computer-readable medium of any of aspects 1 through 11, further including operations, features, circuitry, logic, means, or instructions, or any combination thereof for performing a refresh operation to transfer data written to the set of memory cells to one or more second sets of memory cells based on determining that an indication of degradation of the set of memory cells exceeds a second threshold.

Figure 7:
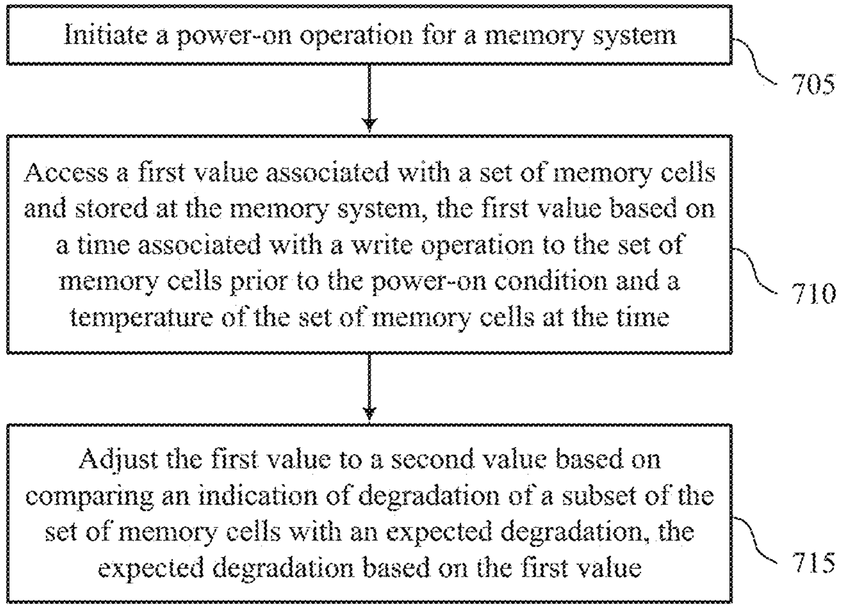

FIG. 7 illustrates a flowchart showing a method 700 that supports techniques for managing a voltage recovery operation in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 705, the method may include initiating a power-on operation for a memory system. The operations of 705 may be performed in accordance with examples as disclosed herein. In some examples, aspects of the operations of 705 may be performed by a power control component 540 as described with reference to FIG. 5. For example, the memory system may receive a power-on signal from the host system 105, or may otherwise begin power-on operations—e.g., as described herein, including with reference to the operations described at 405 of FIG. 4.

At 710, the method may include accessing a first value associated with a set of memory cells and stored at the memory system, the first value based on a first time associated with a write operation to the set of memory cells prior to the power-on condition and a temperature of the set of memory cells at the first time. The operations of 710 may be performed in accordance with examples as disclosed herein. In some examples, aspects of the operations of 710 may be performed by an accumulation value control component 530 as described with reference to FIG. 5. For example, the memory system may retrieve the value from a block 170 of memory cells which was previously written—e.g., as described herein, including with reference to the operations described at 305 of FIG. 3 and at 410 of FIG. 4.

At 715, the method may include adjusting the first value to a second value based on comparing an indication of degradation of a subset of the set of memory cells with an expected degradation, the expected degradation based on the first value. The operations of 715 may be performed in accordance with examples as disclosed herein. In some examples, aspects of the operations of 715 may be performed by an accumulation value control component 530 as described with reference to FIG. 5. For example, the memory system may compare, using a memory system controller 115 or a local controller 135, the indication of degradation with the expected degradation to identify the second value—e.g., as described herein, including with reference to the operations described at 425 of FIG. 4.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for initiating a power-on operation for a memory system; accessing a first value associated with a set of memory cells and stored at the memory system, the first value based on a first time associated with a write operation to the set of memory cells prior to the power-on condition and a temperature of the set of memory cells at the first time; and adjusting the first value to a second value based on comparing an indication of degradation of a subset of the set of memory cells with an expected degradation, the expected degradation based on the first value.

Aspect 14: The method, apparatus, or non-transitory computer-readable medium of aspect 13, further including operations, features, circuitry, logic, means, or instructions, or any combination thereof for determining whether a third value associated with the set of memory cells satisfies a threshold at a second time after the first time, the third value based on a second temperature of the set of memory cells and a duration between the first time and the second time and performing a voltage recovery operation to modify a respective voltage of each memory cell of a subset of the set of memory cells based on determining that the third value satisfies the threshold.

Aspect 15: The method, apparatus, or non-transitory computer-readable medium of aspect 14, where performing the voltage recovery operation includes adding a respective voltage to each memory cell of a block of memory cells including the set of memory cells based on determining that the third value satisfies the threshold.

Aspect 16: The method, apparatus, or non-transitory computer-readable medium of any of aspects 13 through 15, further including operations, features, circuitry, logic, means, or instructions, or any combination thereof for identifying the indication of degradation of the subset of the set of memory cells based on determining that the first value satisfies a threshold, where adjusting the first value to the second value is based on the indication.

Aspect 17: The method, apparatus, or non-transitory computer-readable medium of any of aspects 13 through 16, where the indication of degradation is based on a voltage difference between a first voltage associated with a first logic state of the subset and a second voltage associated with a second logic state of the subset.

Aspect 18: The method, apparatus, or non-transitory computer-readable medium of aspect 17, where the difference between the first voltage and the second voltage includes a read window budget associated with the subset.

Aspect 19: The method, apparatus, or non-transitory computer-readable medium of any of aspects 13 through 18, where the indication of degradation is based on a bit error rate of the subset.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms “electronic communication,” “conductive contact,” “connected,” and “coupled” may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term “coupling” (e.g., “electrically coupling”) may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term “isolated” refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms “if,” “when,” “based on,” or “based at least in part on” may be used interchangeably. In some examples, if the terms “if,” “when,” “based on,” or “based at least in part on” are used to describe a conditional action, a conditional process, or connection between portions of a process, the terms may be interchangeable.

The term “in response to” may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be “on” or “activated” if a voltage greater than or equal to the transistor’s threshold voltage is applied to the transistor gate. The transistor may be “off” or “deactivated” if a voltage less than the transistor’s threshold voltage is applied to the transistor gate.

The description set forth herein, in connection with the appended drawings, describes example configurations and does not represent all the examples that may be implemented or that are within the scope of the claims. The term “exemplary” used herein means “serving as an example, instance, or illustration” and not “preferred” or “advantageous over other examples.” The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
performing a write operation to write data to a set of memory cells and to write a value associated with the set of memory cells, the value based on a first temperature associated with the set of memory cells at a first time of performing the write operation;
determining whether the value satisfies a threshold at a second time after the first time, the value based on the first temperature and a second temperature of the set of memory cells at the second time; and
performing a voltage recovery operation to modify a respective voltage of each memory cell of a subset of the set of memory cells based on determining that the value satisfies the threshold.

2. The method of claim 1, further comprising:
modifying the value based on the second temperature and a duration between the first time and the second time, wherein determining whether the value satisfies the threshold is based on modifying the value.

3. The method of claim 2, wherein modifying the value is further based on a metadata associated with the set of memory cells.

4. The method of claim 1, further comprising:
identifying an indication of degradation of the subset of the set of memory cells based on determining that the value satisfies the threshold, wherein performing the voltage recovery operation is further based on determining that the indication of degradation satisfies a second threshold.

5. The method of claim 4, further comprising:
identifying an indication of degradation of a second subset of the set of memory cells based on determining that the value exceeds the threshold; and
refraining from performing a second voltage recovery operation for the second subset of the set of memory cells based on determining that the indication of degradation of the second subset of the set of memory cells satisfies a third threshold.

6. The method of claim 4, wherein the indication of degradation is based on a voltage difference between a first voltage associated with a first logic state of the subset of the set of memory cells and a second voltage associated with a second logic state of the subset of the set of memory cells.

7. The method of claim 6, wherein the voltage difference between the first voltage and the second voltage comprises a read window budget associated with the subset of the set of memory cells.

8. The method of claim 4, wherein the indication of degradation is based on a bit error rate of the subset of the set of memory cells.

9. The method of claim 4, further comprising:
modifying the threshold based on comparing the indication of degradation with an expected degradation, the expected degradation based on a difference between the first time and the second time.

10. The method of claim 1, wherein performing the voltage recovery operation comprises adding a respective voltage to each memory cell of a block of memory cells comprising the set of memory cells based on determining that the value satisfies the threshold.

11. The method of claim 1, further comprising:
identifying the first time based on an oscillator; and
measuring the first temperature based on a temperature sensor associated with the set of memory cells.

12. The method of claim 1, further comprising:
performing a refresh operation to transfer data written to the set of memory cells to one or more second sets of memory cells based on determining that an indication of degradation of the set of memory cells exceeds a second threshold.

13. A method, comprising:

initiating a power-on operation for a memory system;

accessing a first value associated with a set of memory cells and stored at the memory system, the first value based on a first time associated with a write operation to the set of memory cells prior to the power-on operation for the memory system and a temperature of the set of memory cells at the first time; and adjusting the first value to a second value based on comparing an indication of degradation of a subset of the set of memory cells with an expected degradation, the expected degradation based on the first value.

14. The method of claim 13, further comprising:

determining whether a third value associated with the set of memory cells satisfies a threshold at a second time after the first time, the third value based on a second temperature of the set of memory cells and a duration between the first time and the second time; and performing a voltage recovery operation to modify a respective voltage of each memory cell of a subset of the set of memory cells based on determining that the third value satisfies the threshold.

15. The method of claim 14, wherein performing the voltage recovery operation comprises adding a respective voltage to each memory cell of a block of memory cells comprising the set of memory cells based on determining that the third value satisfies the threshold.

16. The method of claim 13, further comprising:

identifying the indication of degradation of the subset of the set of memory cells based on determining that the first value satisfies a threshold, wherein adjusting the first value to the second value is based on the indication of degradation.

17. The method of claim 13, wherein the indication of degradation is based on a voltage difference between a first voltage associated with a first logic state of the subset of the set of memory cells and a second voltage associated with a second logic state of the subset of the set of memory cells.

18. The method of claim 17, wherein the voltage difference between the first voltage and the second voltage comprises a read window budget associated with the subset of the set of memory cells.

19. The method of claim 13, wherein the indication of degradation is based on a bit error rate of the subset of the set of memory cells.

20. An apparatus, comprising: a controller associated with a memory device, wherein the controller is configured to cause the apparatus to:

perform a write operation to write data to a set of memory cells and to write a value associated with the set of memory cells, the value based on a first temperature associated with the set of memory cells at a first time of performing the write operation;

determine whether the value satisfies a threshold at a second time after the first time, the value based on the first temperature and a second temperature of the set of memory cells at the second time; and perform a voltage recovery operation to modify a respective voltage of each memory cell of a subset of the set of memory cells based on determining that the value satisfies the threshold.

* * * * *